(12) United States Patent
Tsang (10) Patent No.: US 8,247,310 B2
(45) Date of Patent: Aug. 21, 2012

(54) METHOD FOR MAKING GALLIUM NITRIDE SUBSTRATE

(75) Inventor: Jian-Shihn Tsang, New Taipei (TW)

(73) Assignee: Hon Hai Precision Industry Co., Ltd., Tu-Cheng, New Taipei (TW)

(*) Notice: Subject to any disclaimer, the term of this patent is extended or adjusted under 35 U.S.C. 154(b) by 0 days.

(21) Appl. No.: 13/049,911

(22) Filed: Mar. 17, 2011

(65) Prior Publication Data

US 2012/0190172 A1    Jul. 26, 2012

(30) Foreign Application Priority Data

Jan. 24, 2011 (TW) .............................. 100102407 A (51) Int. Cl.
*H01L 21/30* (2006.01)
*H01L 21/46* (2006.01)

(52) U.S. Cl. ....................................................... 438/458

(58) Field of Classification Search .................. 438/458; 257/13, 79, 82, 88, 918, E33.001
See application file for complete search history.

(56) References Cited

U.S. PATENT DOCUMENTS

| 5,374,564 A * | 12/1994 | Bruel .............................. 438/455 |
| 6,562,644 B2 * | 5/2003 | Ishida et al. ..................... 438/29 |
| 7,670,930 B2 * | 3/2010 | Tauzin et al. ................... 438/458 |

* cited by examiner

*Primary Examiner* — Matthew W Such
*Assistant Examiner* — Monica D Harrison
(74) *Attorney, Agent, or Firm* — Altis Law Group, Inc.

(57) ABSTRACT

A method for making a GaN substrate for growth of nitride semiconductor is provided. The method first provides a GaN single crystal substrate. Then an ion implanting layer is formed inside the GaN single crystal substrate, which divides the GaN single crystal substrate into a first section and a second section. After that, the GaN single crystal substrate is connected with an assistant substrate through a connecting layer. Thereafter, the GaN single crystal substrate is heated whereby the ion implanting layer is decompounded. Finally, the second section is separated from the first section. The first section left on a surface of the assistant substrate is provided for growth of nitride semiconductor thereon.

17 Claims, 8 Drawing Sheets

METHOD FOR MAKING GALLIUM NITRIDE SUBSTRATE

1. TECHNICAL FIELD

The disclosure generally relates to a method for forming a gallium nitride substrate, and especially to a method for forming a gallium nitride substrate which is suitable for growth of nitride semiconductor.

2. DESCRIPTION OF RELATED ART

In recent years, due to excellent light quality and high luminous efficiency, light emitting diodes (LEDs) have increasingly been used to substitute for incandescent bulbs or compact fluorescent lamps or fluorescent tubes as a light source of an illumination device.

GaN compound semiconductors, such as gallium nitride (GaN), indium gallium nitride (InGaN), and gallium aluminum nitride (GaAlN) have been highly used for materials of blue light emitting diodes (LEDs). Sapphire is presently widely used as a substrate for the growth of GaN. However, the sapphire substrate is different from GaN in lattice constant. When GaN is grown directly on the sapphire substrate, numerous defects will occur between the sapphire substrate and GaN crystal layer. The defects will be an obstacle to light efficiency of LEDs.

Therefore, a method for forming an improved GaN substrate is desired to overcome the above described shortcomings.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

An embodiment of a method for forming a GaN substrate will now be described in detail below and with reference to the drawings.

Figure 1:
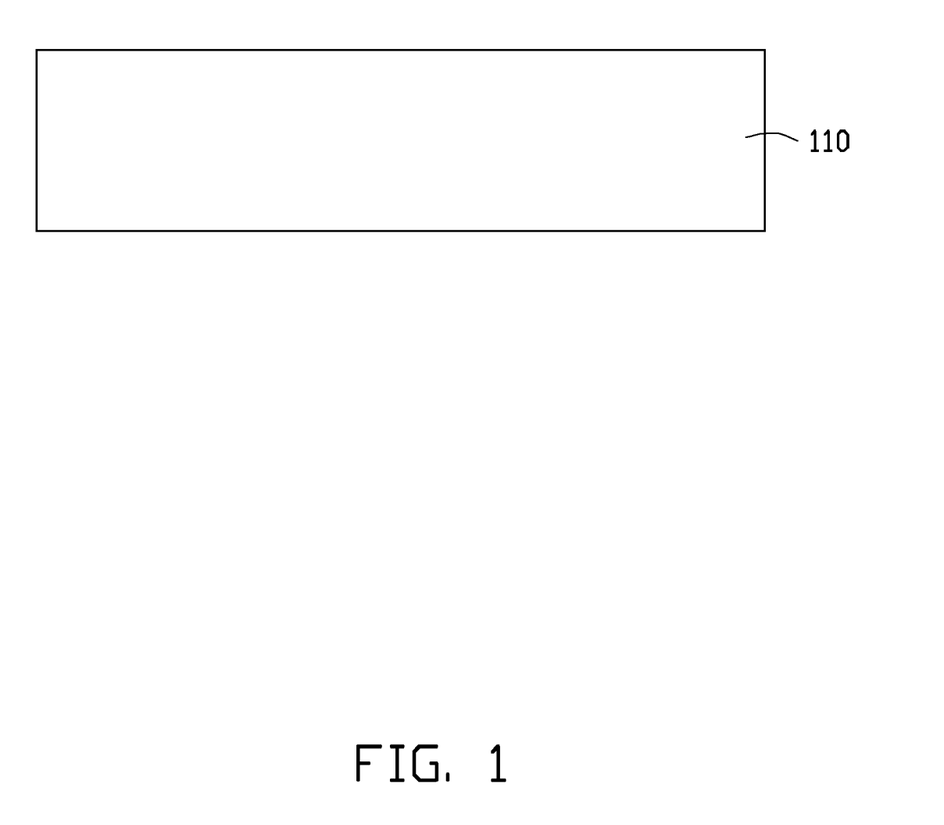
FIG. 1 is a cross-sectional view showing a GaN single crystal substrate for forming a GaN substrate in accordance with a first embodiment of the present disclosure.

Referring to FIG. 1, a GaN single crystal substrate 110 is first provided. The single crystal substrate 110 can be formed by hydride vapor epitaxy (HYPE), ammonothermal method or metal-organic chemical vapor deposition (MOCVD). A thickness of the GaN single crystal substrate 110 is between 20 microns and 500 microns.

Figure 2:
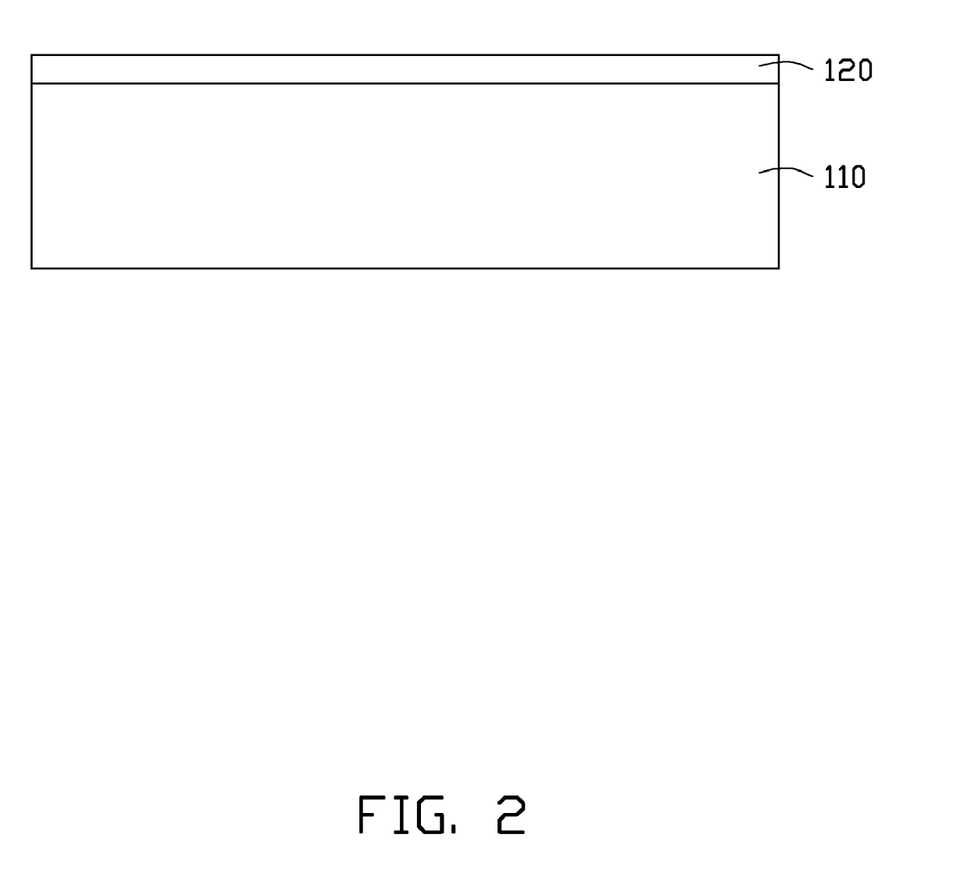
FIG. 2 is a cross-sectional view showing formation of a mask layer on the GaN single crystal substrate of FIG. 1.

Referring to FIG. 2, a mask layer 120 is then formed on a surface of the GaN single crystal substrate 110. The mask layer 120 can be silicon nitrides ($SiN_x$) or silicon oxides ($SiO_x$). The mask layer 120 is used for controlling the cleanness of the surface of the single crystal substrate 110.

Figure 3:
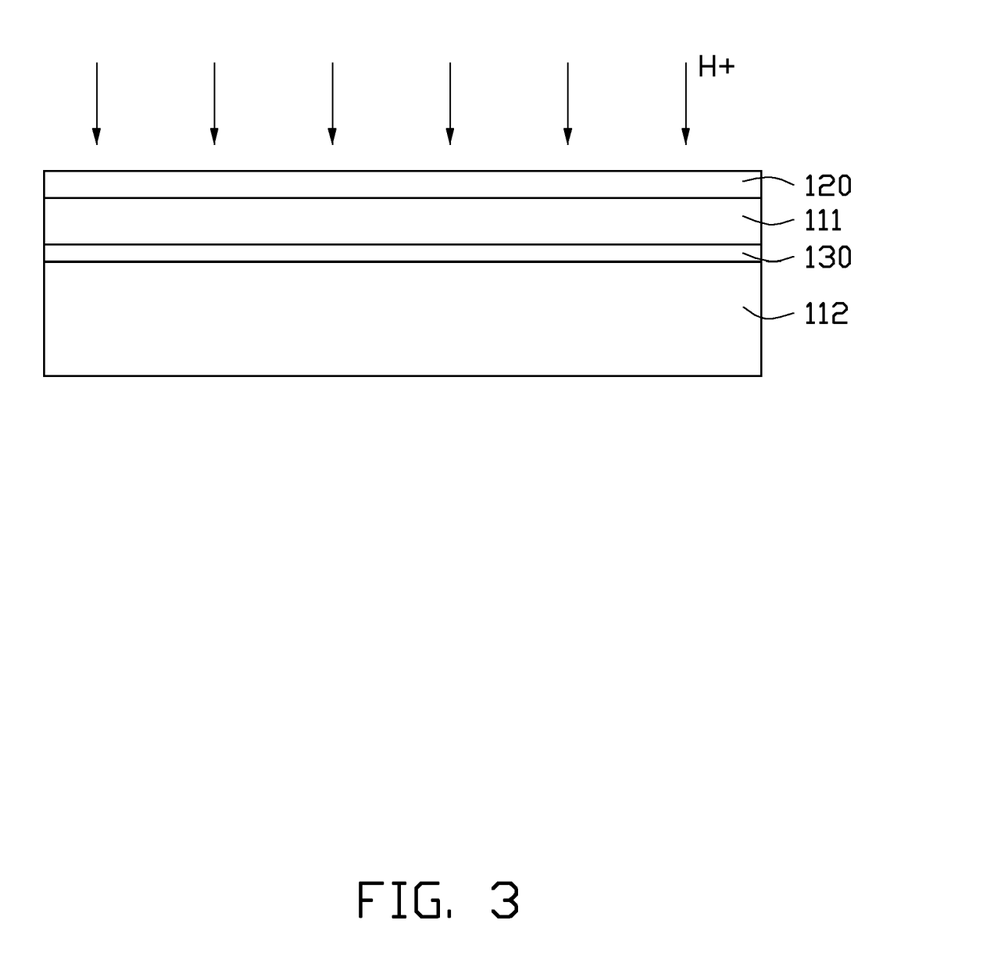
FIG. 3 is a cross-sectional view showing formation of an ion implant layer inside the GaN single crystal substrate of FIG. 2.

Referring to FIG. 3, ions are implanted into the single crystal substrate 110 from the surface having the mask layer 120. An ion implant layer 130 is then formed inside the GaN single crystal layer 110 and divides the GaN single crystal substrate 110 into a first section 111 and a second section 112. In this embodiment, the ions implanted into the GaN single crystal substrate 110 are hydrogen ions. The implanting energy of the hydrogen ions is greater than 100 keV and the implanting concentration of the hydrogen ions is greater than $1 \times 10^{15}$ $cm^{-2}$. A distance between the ion implant layer 130 and the surface of the GaN single crystal substrate 110 adjacent to the mask layer 120 is larger than 1 micron. This means a thickness of the first section 111 is larger than 1 micron. The distance between the ion plant layer 130 and the surface of the GaN single crystal substrate 110 is controlled by the implanting energy. An increase of implanting energy will increase the distance between the ion plant layer 130 and the surface of the GaN single crystal substrate 110. In addition, the implanting concentration affects degrees of destruction of GaN lattices at a position where the ion implant layer 130 is. The increase of the implanting concentration enhances the destruction of GaN lattices. Thus, the ion implant layer 130 can be easily decompounded for separating the second section 112 from the first section 111.

Figure 4:
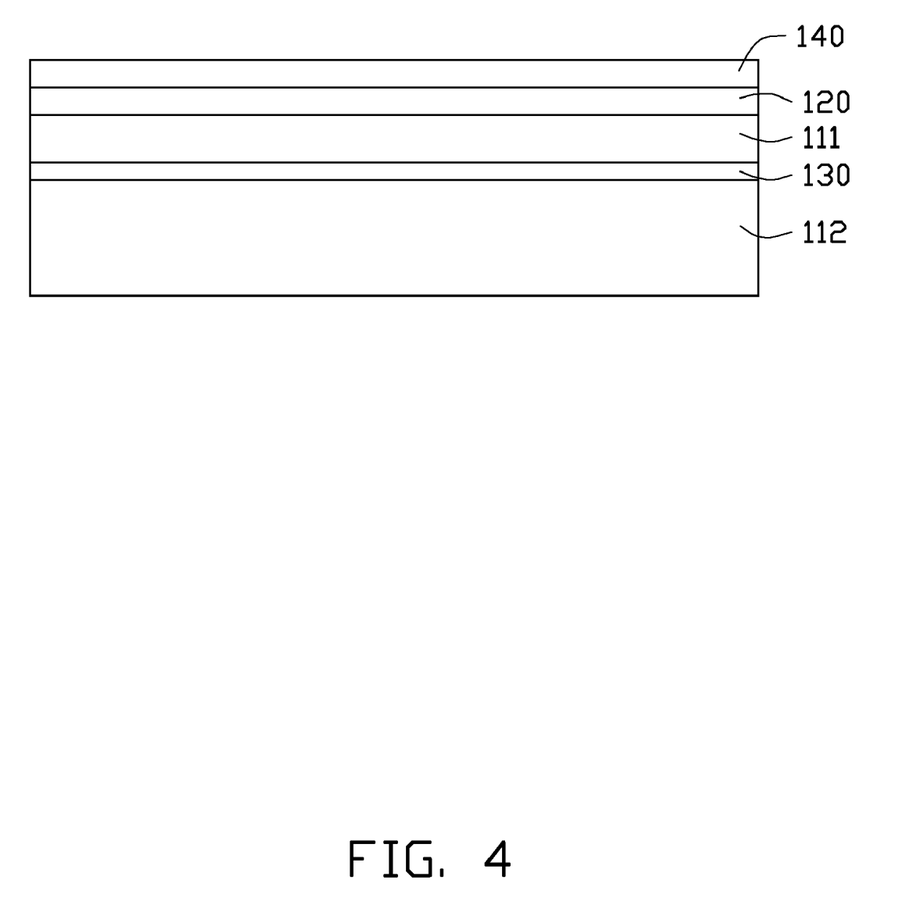
FIG. 4 is a cross-sectional view showing formation of a first metal layer on the mask layer of FIG. 3.

Referring to FIG. 4, a first metal layer 140 is formed on a surface of the mask layer 120 opposite to the GaN single crystal substrate 110. The first metal layer 140 can be made of chromium and formed on the mask layer 120 by electron beam vapor deposition or plasma vapor deposition. In alternative embodiments, after the ion implant layer 130 is formed inside the GaN single crystal substrate 110, the mask layer 120 can be removed from the GaN single crystal substrate 110. And then, the first metal layer will be formed directly on the surface of the GaN single crystal substrate 110.

Figure 5:
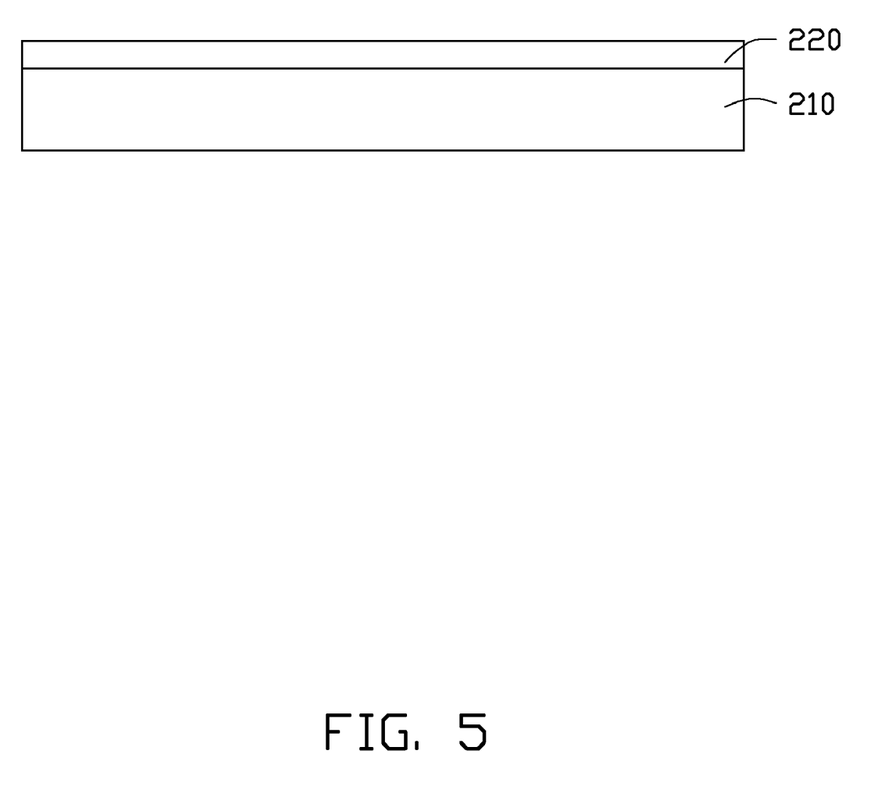
FIG. 5 is a cross-sectional view showing an assistant substrate with a second metal layer for forming the GaN substrate in accordance with the first embodiment.

Referring to FIG. 5, an assistant substrate 210 with a second metal layer 220 is provided. The assistant substrate 210 is selected from the group consisting of silicon substrate, alumina substrate and aluminum nitride substrate. The second metal layer 220 is formed on a surface of the assistant substrate 210 by electron beam vapor deposition or plasma vapor deposition. Similar to the first metal layer, the second metal layer 220 can also be made of chromium.

Figure 6:
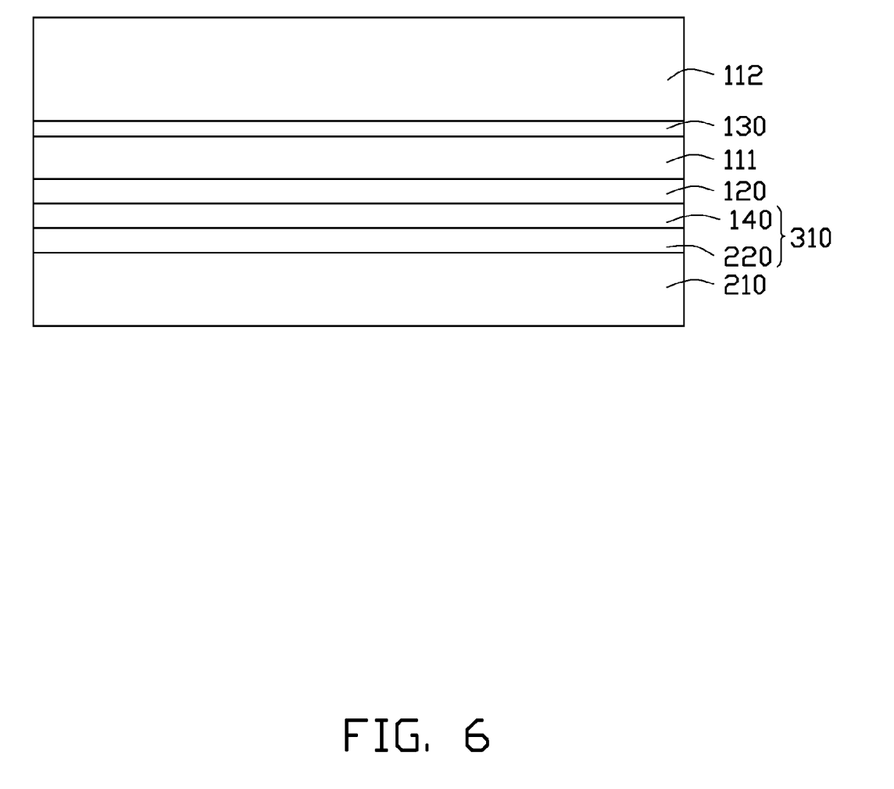
FIG. 6 is a cross-sectional view showing connection of the GaN single crystal substrate to the assistant substrate.

Referring to FIG. 6, the second metal layer 220 is connected to the first metal layer 140 to cooperatively form a connecting layer 310. The connecting layer 310 connects the GaN single crystal substrate 110 with the assistant substrate 210. In this embodiment, in order to increase the joining force between the first metal layer 140 and the second metal layer 220, a thermal treatment is provided to the first metal layer 140 and the second metal layer 220 during the connection between the first metal layer 140 with the second metal layer 220. In addition, the thermal treatment is processed in an ammonia gas ambient for nitriding the connecting layer 310. A metal nitride, such as chromium nitride, can be formed during the process of nitriding the connecting layer 310. The metal nitride functions as a buffer layer between the GaN single crystal substrate 110 and the assistant substrate 210, and reduces the lattice distortion of the GaN single crystal substrate 110 caused by the assistant substrate 210.

Figure 7:
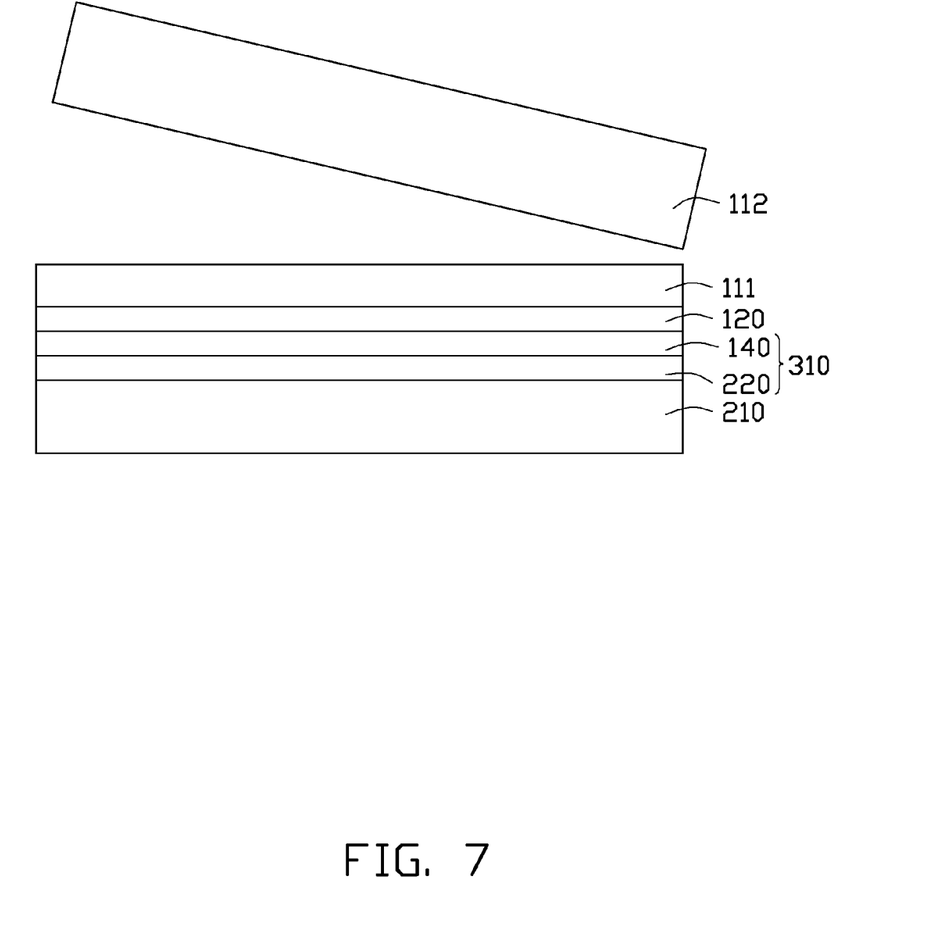
FIG. 7 is a cross-sectional view showing separation of a second section from a first section of the GaN single crystal substrate FIG. 1.

Referring to FIG. 7, the GaN single crystal substrate 110 is heated at a temperature between 600 to 900 to make the ion implant layer 130 be decompounded. The second section 112 is separated from the first section 111, and the first section 111 is left on a surface of the assistant substrate 210. The first section 111 left on the assistant substrate 210 can be used as a GaN substrate for growing a nitride semiconductor. Because the lattice constant of the first section 111 is matching that of the nitride semiconductor, the nitride semiconductor grown on the first section 111 will have less crystal defects than that grown directly on a sapphire substrate.

Figure 8:
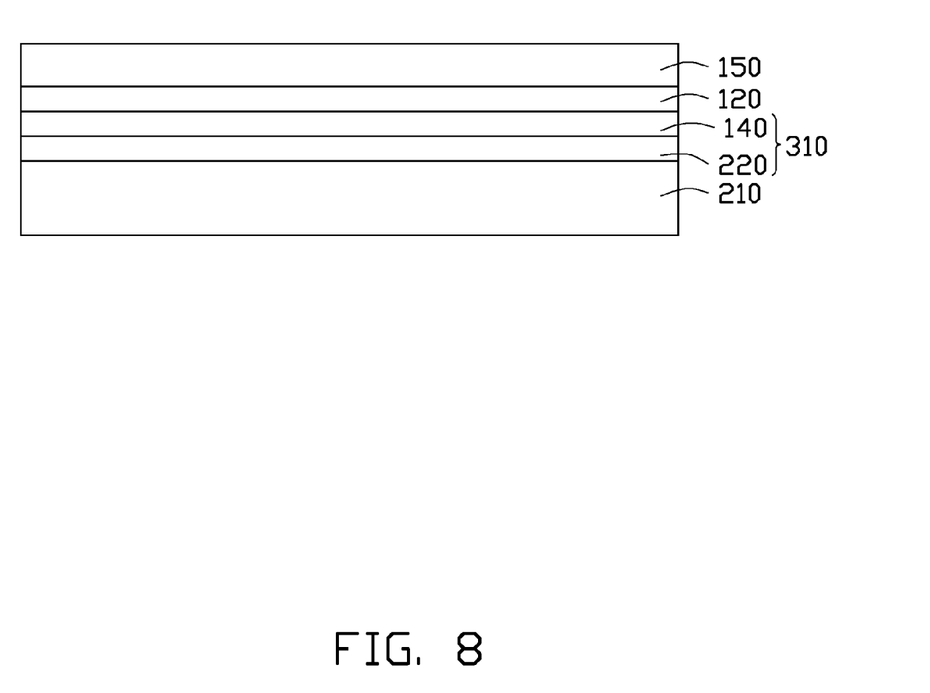
FIG. 8 is a cross-sectional view showing formation of a GaN film by the first section of FIG. 7.

In alternative embodiments, the first section 111 is polished or milled to form a GaN film 150 for growth of nitride semiconductor, as referring to FIG. 8. A thickness of the GaN film 150 is not less than 100 nm.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A method for making a GaN substrate, comprising steps of:
providing a GaN single crystal substrate;
forming an ion implanting layer inside the GaN single crystal substrate, the ion planting layer dividing the GaN single crystal substrate into a first section and a second section;
providing an assistant substrate and a connecting layer and connecting the GaN single crystal substrate to the assistant substrate through the connecting layer;
heating the GaN single crystal substrate to make the ion implanting layer decompounded; and
separating the second section from the first section to have the first section left on a surface of the assistant substrate for growing a nitride semiconductor on the first section;
wherein the method of forming the connecting layer comprises steps of:
forming a first metal layer on a surface of the GaN single crystal substrate;
forming a second metal layer on a surface of the assistant substrate; and
connecting the first metal layer with the second metal layer to cooperatively form the connecting layer.

2. The method for making a GaN substrate of claim 1, wherein the method of forming the ion implanting layer comprises steps of:
forming a mask layer on a surface of the GaN single crystal substrate; and
implanting ions into the GaN single crystal substrate from the surface having the mask layer and forming the ion implanting layer inside the GaN single crystal substrate.

3. The method for making a GaN substrate of claim 2, wherein after forming the ion implanting layer inside the GaN single crystal substrate, the mask layer is removed from the GaN single crystal substrate.

4. The method for making a GaN substrate of claim 2, wherein the ions implanted into the GaN single crystal substrate are hydrogen ions.

5. The method for making a GaN substrate of claim 4, wherein an implanting energy of the hydrogen ions is greater than 100 keV.

6. The method for making a GaN substrate of claim 4, wherein an implanting concentration of the hydrogen ions is greater than $1 \times 10^{15}$ cm$^{-2}$.

7. The method for making a GaN substrate of claim 1, wherein a thickness of the first section is greater than 1 micron.

8. The method for making a GaN substrate of claim 1, wherein a thermal treatment is provided to the first metal layer and the second metal layer during the step of connecting the first metal layer with the second metal layer.

9. The method for making a GaN substrate of claim 8, wherein the thermal treatment is processed in an ammonia gas ambient for nitriding the connecting layer.

10. The method for making a GaN substrate of claim 1, wherein the first metal layer and the second metal layer are made of chromium.

11. The method for making a GaN substrate of claim 1, wherein the first metal layer is formed on the surface of the GaN single crystal substrate by electron beam vapor deposition or plasma vapor deposition.

12. The method for making a GaN substrate of claim 1, wherein the second metal layer is formed on a surface of the assistant substrate by electron beam vapor deposition or plasma vapor deposition.

13. The method for making a GaN substrate of claim 1, wherein the assistant substrate is selected from the group consisting of silicon substrate, alumina substrate and aluminum nitride substrate.

14. The method for making a GaN substrate of claim 1, wherein after second section is separated from the first section to have the first section left on the surface of the assistant substrate, a step of polishing the first section to form a GaN film is proceeded.

15. The method for making a GaN substrate of claim 14, wherein a thickness of the GaN film is not less than 100 nm.

16. The method for making a GaN substrate of claim 1, wherein the heating of the GaN single crystal substrate is processed at a temperature of 600° C. to 900° C.

17. The method for making a GaN substrate of claim 1, wherein a thickness of the GaN single crystal substrate is between 20 microns and 500 microns.

* * * * *